US011887872B2

(12) United States Patent
Berendsen et al.

(10) Patent No.: US 11,887,872 B2
(45) Date of Patent: Jan. 30, 2024

(54) METHOD AND DEVICE FOR SELECTIVELY SEPARATING ELECTRONIC COMPONENTS FROM A FRAME WITH ELECTRONIC COMPONENTS

(71) Applicant: Besi Netherlands B.V., Duiven (NL)

(72) Inventors: Arjan Joan Berendsen, Duiven (NL); Johannes Gerhardus Augustinus Zweers, Duiven (NL)

(73) Assignee: Besi Netherlands B.V., Duiven (NL)

( * ) Notice: Subject to any disclaimer, the term of this patent is extended or adjusted under 35 U.S.C. 154(b) by 267 days.

(21) Appl. No.: 17/272,689

(22) PCT Filed: Jul. 19, 2019

(86) PCT No.: PCT/NL2019/050461
§ 371 (c)(1),
(2) Date: Mar. 2, 2021

(87) PCT Pub. No.: WO2020/050710
PCT Pub. Date: Mar. 12, 2020

(65) Prior Publication Data
US 2021/0358774 A1 Nov. 18, 2021

(30) Foreign Application Priority Data
Sep. 3, 2018 (NL) ..................................... 2021552

(51) Int. Cl.
*H01L 21/67* (2006.01)
*H01L 21/78* (2006.01)
(52) U.S. Cl.
CPC ........ *H01L 21/67092* (2013.01); *H01L 21/78* (2013.01)

(58) Field of Classification Search
CPC . H01L 21/67092; H01L 21/78; H01L 23/544; H01L 21/67271; H01L 2223/54433; H01L 2223/54486
USPC ......................................................... 438/111
See application file for complete search history.

(56) References Cited

U.S. PATENT DOCUMENTS

| 4,631,996 A | * | 12/1986 | Magnuson | ............ | B21D 45/006 |
| | | | | | 83/639.1 |
| 5,046,389 A | * | 9/1991 | Thompson | ........ | H01L 21/67271 |
| | | | | | 83/639.1 |
| 5,135,034 A | * | 8/1992 | Miyamoto | ......... | H05K 13/0092 |
| | | | | | 140/105 |

(Continued)

FOREIGN PATENT DOCUMENTS

| CN | 105855375 A | 8/2016 |
| EP | 2330613 A2 | 6/2011 |

(Continued)

*Primary Examiner* — Vu A Vu
(74) *Attorney, Agent, or Firm* — The Webb Law Firm

(57) ABSTRACT

The present invention relates to a device for selective separating electronic components from a frame with electronic components including at least two press parts; drive means for moving the press parts; a guide for guiding frames between the press parts; a plurality of punches in a first press part and a plurality of openings in a second press part. The invention also provides a system for in-line selective separating electronic components from a frame with electronic components and a method for selective separating electronic components from a frame with electronic components.

23 Claims, 4 Drawing Sheets

(56) References Cited

U.S. PATENT DOCUMENTS

| | | | | |
|---|---|---|---|---|
| 5,144,872 | A * | 9/1992 | Kakimoto | B26F 1/04 |
| | | | | 83/13 |
| 5,807,455 | A * | 9/1998 | Giordano | B30B 1/40 |
| | | | | 100/291 |
| 7,553,436 | B2 * | 6/2009 | Dukler | B30B 11/08 |
| | | | | 264/109 |
| 7,713,469 | B2 * | 5/2010 | Schmidt | B29C 43/58 |
| | | | | 419/68 |
| 8,119,045 | B2 * | 2/2012 | Schmidt | A61J 3/10 |
| | | | | 73/824 |
| 9,362,183 | B2 | 6/2016 | Sakai et al. | |
| 11,007,667 | B2 * | 5/2021 | Meilin | B65H 35/0073 |
| 2007/0103178 | A1 * | 5/2007 | Kasukabe | G01R 1/0735 |
| | | | | 324/755.05 |
| 2010/0319503 | A1 * | 12/2010 | Bakker | B26F 1/14 |
| | | | | 83/13 |
| 2011/0024937 | A1 * | 2/2011 | Dukler | B30B 11/08 |
| | | | | 264/109 |
| 2011/0128004 | A1 | 6/2011 | Lim et al. | |
| 2014/0260438 | A1 * | 9/2014 | Matsumura | B26D 7/02 |
| | | | | 69/21 |

FOREIGN PATENT DOCUMENTS

| | | |
|---|---|---|
| JP | H594780 U | 12/1993 |
| JP | H727822 A | 1/1995 |
| JP | 200666701 A | 3/2006 |
| JP | 201422445 A | 2/2014 |
| KR | 1020080109226 A | 12/2008 |
| WO | 2011018847 A1 | 2/2011 |

* cited by examiner

METHOD AND DEVICE FOR SELECTIVELY SEPARATING ELECTRONIC COMPONENTS FROM A FRAME WITH ELECTRONIC COMPONENTS

CROSS-REFERENCE TO RELATED APPLICATIONS

This application is the United States national phase of International Application No. PCT/NL2019/050461 filed Jul. 19, 2019, and claims priority to The Netherlands Patent Application No. 2021552 filed Sep. 3, 2018, the disclosures of which are hereby incorporated by reference in their entirety.

BACKGROUND OF THE INVENTION

Field of the Invention

The present invention relates to a device for selective separating electronic components from a frame with electronic components and to a system for in-line selective separating electronic components from a frame with electronic components. The invention also provides a method for selective separating electronic components from a frame with electronic components.

Description of Related Art

During the process of manufacturing electronic components, these are usually manufactured in larger units (assemblies) of joined electronic components which units subsequently are divided into smaller units of one or several individual electronic components. Electronic components are in relation to the present invention envisaged as semiconductors (chips, although LEDs are in this respect also deemed semiconductors) or other smaller passive or active electronic components. Examples of larger units with electronic components are packages with a plurality of optionally wholly or partially encapsulated electronic components placed on a carrier, like for instance a lead frame. The dividing of the electronic components in smaller or individual units is also referred to as separating, singulating or individualizing the electronic components. The separation into smaller units of for instance individualised electronic components may be realized by means of various types of machining processes, such as punching, sawing, liquid cutting and/or laser cutting. After separating all the electronic components from a complete carrier (thus subdividing the complete carrier) the electronic components may be sorted by a sorter; differentiating selected (e.g. reject) components from other (e.g. approved) components.

The individualised electronic components may then be further processed on an individual bases or they may be placed in groups on carrier plates wherein the orientation of the individualised components may be different when compared with their orientation wherein they were placed in their original joined orientation before separation. The present method of processing electronic components enables a high level of accuracy in the processing however the capacity of the processing equipment is limited and thus relative high investments in machine capacity is required.

SUMMARY OF THE INVENTION

The present invention has for its object to provide alternative equipment and an alternative method for processing electronic components that enable to increase the processing capacity while maintaining or even further enhancing the quality level of the electronic component processing.

The invention provides for this purpose a device for selective separating electronic components from a frame with electronic components, comprising; at least two press parts which are displaceable relative to each other; drive means for moving the press parts towards and away from each other; a guide for guiding frames between the press parts; a plurality of punches installed in a first press part, which punches are connecting to individual punch controls; a plurality of openings in a second press part, opposite to the individually controlled operative punches in the first press part; and an intelligent control system connecting to the individual punch controls. The first special insight of the present invention is that electronic components are selectively separated from a frame. According the prior art the separation of electronic components was a general process that had no relation with any selection of specific electronic components; the selection of specific electronic components was provided in a subsequent dedicated section process. However according the present invention the selection is now combined with a separation process. The selective separation is executed by "punches" being tools for piercing or stamping those electronic components from a frame that have to be selectively removed by moving the frame along the press parts. During each press stroke those punches that will act in removing an electronic component from the frame (strip) are to be brought in an operative (active or extracted) position by the individual punch controls so the punches may be individually moveable between an operative position and an inoperative position. The punches on locations where electronic components have to stay fixed in the frame are to be held in an in-operative (inactive of retracted) position. During the stroke of the press parts the operative/active/ extracted punches will push the selected electronic components from the frame and into the openings in the press part opposite to the press part carrying the punches. In other words: in the operative position a punch is at least partially protruding from a contact surface of the first press part and in an inoperative position a punch is not protruding from a contact surface of the first press part. The pressure for the separating of the electronic components may thus be provided by the drive of the press parts; the controls of the punches are then only used for positioning of the punches. However as an alternative the punches may also be moved in the housing (press part) during the separation process. The control of the forward movement of the frame, the control of the press and the positioning of the individual punches is steered by the intelligent control system that is fed with information indicating which electronic components have to be removed from the frame. An important advantage of the separating device according the invention is that the lead time of the electronic components may substantially be increased and that a subsequent selection step of electronic components of certain (e.g. limited) quality levels is now superfluous. Another advantage is also that electronic components that may adversely affect any subsequent processing steps may be removed before they will have their negative influence. An example are incomplete moulded electronic components; these type of limited quality electronic components may adversely affect the in-frame forming of parts in the frame (like bending leads). In the situation according the present invention the inadequate moulded components may be removed from the frame before they may disturb such in-frame forming process.

The individual punch controls may be cylinders, for instance hydraulic or pneumatic driven cylinders. Dependent on the number of punches to be controlled the press part holding the punches may have to be provided of a substantial number of cylinders. In case the space available for holding the cylinders is a problem it is possible to locate the cylinders at more than one level in the press part.

For moving the frames along the guide between the press parts the separating device comprises a drive, which drive has to be able to bring the frames in the correct position before the press parts are moved to activate the punches (if any). A correct positioning of the frame between the press parts is elementary for a correct an accurate selective separation of the electronic components to be removed from the frame. However additional to the positioning of the frames with the guide drive also the press parts may be provided with (fine) positioning elements like for instance a cooperating pin hole assembly (with e.g. pins in a press part and positioning holes in the frames). The intelligent control system preferably connects to the frame drive for automatic and accurate positioning the frame each stroke.

The openings in the second press part may connect to at least one collecting bin for receiving punched out electronic components. The in a bin collected separated electronic components are thus know to have specific characteristics that correspond to a certain electronic component quality level. Dependent on which type of electronic components are separated these components may be used for a suited field of application. For instance electronic components with lower, but still remaining limited functionality may be used in less demanding applications.

In case electronic components with varying qualities separated it may be useful that the separating device may comprise plural collecting bins, which collecting bins are displaceable by a collecting bin drive and the intelligent control system connects to the collecting bin drive. These displaceable collecting bins may enable to collect various quality levels of separated electronic components in various collecting bins.

The intelligent control system may be configured to control the individual punch controls and the frame drive to perform multiple successive punching operations, wherein the frame drive retains the frame in the same position along the frame guide and the collecting bin drive exchanges collection bins between said subsequent punching operations. In this manner the intelligent control system enables the device according to the present invention to efficiently sort separated electronic components in different collecting bins based on certain selection criteria. The fact that the lead frame remains in the same position during the successive punching operations hereby speeds up the separation and sorting operation.

The intelligent control system may in a common instance be configured to control the individual punch controls and the frame drive based on information on component quality level obtained from previous operations performed on the frame with electronic components. Such previous operations may include inspection operations wherein the electronic components are solely inspected on quality aspects as well as operations for manipulating/machining the electronic components such as forming, trimming, separating and moulding operations from which the quality of the electronic components can also be derived. Commonly, such information is stored on a high-level host computer and retrievable by/passed onto the intelligent control system to make it available to said intelligent control system either directly or in a processed form. In the end, the intelligent control system uses this information in the selection of electronic components that need to be separated through a punching operation.

The intelligent control system may further be configured to use the quality level information obtained during one operation performed on the frame with electronic components to set the individual punch controls during a first punching operation and to use the quality level information obtained during another operation performed on the frame with electronic components to set the individual punch controls during a successive punching operation. During each of the successive punching operations, component quality level information obtained during a different one of said previously performed operations is thus used to determine which of the components are separated from the frame. As an example, during moulding of the electronic components the package is checked for non-fills or voids, while after a subsequent process of bending the leads of the electronic components, the quality (e.g. form and position) of the leads is inspected by an inspection station. The data on the package quality in terms of voids and non-fills is then used to define a selection criterion on the basis of which a first set of electronic components that does not meet the package quality requirements is separated during a first punching operation. Said first set of separated components end up in a first collection bin. Subsequently, the data on the quality of the leads is used to define a selection criterion on the basis of which a second set of electronic components that does not meet the quality requirements for leads is separated during a second punching operation. Said second set of separated components end up in a second collection bin.

The punches in the first press part may be installed in a line, which line of punches is oriented perpendicular to the frame guide. Preferably such a line of punches hold a number of punches that is in line with the number of electronic components in a column of the frame. With a single line of punches each stroke of the press parts then one column of the frame may be moved along the punches. In the situation that the punches in the first press part are installed in plural lines, which lines of punches are oriented perpendicular to the frame guide, the frame may me moved forward with larger steps in case the lines of punches act on various columns of electronic components. For instance with two lines of punches it may be possible to make (double) steps of each time two columns. The lines of punches may be adjoining but from a mechanical point of view it may be preferable to place the lines of punches on a larger distance; the only condition is that they have to act on various columns (e.g. odd and even) columns.

The invention also provides a system for in-line selective separating electronic components from a frame with electronic components, comprising at least one separating device according the invention and as described above, and at least a loader and/or off-loader for frames with electronic components. The separating device is well suited to be incorporated in a longer or short electronic component processing line. Such line of electronic component processing may be provided with a loader (loading handler) that individually takes frames with electronic components from a holder (cassette) and/or an off-loader (off-loading handler) that individually places frames with electronic components (and possibly one or more open positions where electronic components are separated from the frame) into a holder.

The system for in-line selective separating electronic components may also comprise at least one inspection unit for individual inspection of the electronic components in a frame. As an example a vision inspection unit with one or more camera's may check the (lack of) quality of a moulded housing, and another example is an measurement with electronical contact of the (lack of) electronic characteristics of each electronic components. Dependent on the results of such inspection a signal may be provided by the intelligent control to the separating device to remove certain components from the frame later in the in-line process.

The system may also comprises a processing unit acting on the frames of electronic components, like for instance processing units for moulding, forming (e.g. bending), trimming, separating, marking and/or lasering (a part of) the electronic components.

Marking of the electronic components may be required as a way to easily identify dysfunctional electronic components during later operations performed on the electronic components.

In a particular embodiment of the system for in-line selective separating electronic components according to the invention, the processing unit is a forming unit or a trimming unit for manipulating electronic components connected to a frame, which processing unit is positioned either upstream or downstream from the separating device. An example of a forming unit which may be used as processing unit is a unit for bending the leads of electronic components connected to a frame. It should hereby be understood that the bending of the leads is an in-frame forming process wherein the electronic components remain connected to the lead frame during the bending operation, for example by means of tie bars that are not yet separated from the frame that are typically connected to a heat sink or die pad of the electronic components. Alternatively, the electronic components could remain connected to the lead frame by clamping the lead frame between parts of the package, for example by moulding the package partly over edges of the lead frame. The leads to be bended are (at least at the moment of the bending operation) however separated from the lead frame, which separation of the leads from the lead frame may take place directly before the bending operation or earlier in the process. Said process of separating the leads from the lead frame is a possible trimming operation performed by a trimming unit which may be used as processing unit comprised in the system for in-line selective separating electronic components according to the invention. Other possible operations that could be performed by a trimming unit include cutting of the lead ends that are typically still connected to each other during bending of the leads, or cutting of the dam bars connecting the bases of the leads adjacent to the package during moulding to prevent moulding material from flowing out of the mould cavity via the interspace between the leads.

In the case the forming unit or trimming unit is positioned upstream the separation device according to the present invention, the outcome of the manipulation of the electronic components may (in part) determine which electronic components are separated from the frame during the selective separation. Due to this upfront separation/rejection, it is prevented that electronic components that do not meet certain quality requirements end up in subsequent processing steps, thereby leading to the possible interruption of said process or the malfunctioning of the involved tools/process stations. In the case the forming unit or trimming unit is positioned downstream the separation device according to the present invention, any electronic components that may adversely affect the subsequent forming or trimming operation may be removed from the frame before they will have their negative influence.

The present invention further relates to a method for selective separating electronic components from a frame with electronic components with a separating device according to the invention, comprising the processing steps of: A) opening the press parts by moving the press parts away from each other; B) feeding a frame with electronic components over a controlled distance forwards between the moved apart press parts; C) selective activating those punches of the plurality of punches that correspond to the positions of a first set of electronic components that during a next processing step have to be separated from the frame; and D) moving the press parts towards each other such that the activated punches on the corresponding locations separate the electronic components from the frame.

In the method according to the invention, step D) is followed up by re-executing steps A), C) and D) while the frame is retained in the same position between the press parts, wherein during the re-execution of step C), those punches of the plurality of punches are selectively activated that correspond to the positions of a second set of electronic components that during a next processing step have to be separated from the frame. The second set of electronic components hereby typically differs from the first set of electronic components separated from the frame during the previous performance of step D). By keeping the frame in the same position during the successive punching operations, separation of the electronic components can take place in a particularly efficient manner. Additionally, the controlled location (e.g. a first collection bin) for receiving the first set of electronic components separated during the first punching operation may between the successive punching operations be changed for another controlled location (e.g. a second collection bin) in which the second set of electronic components separated during the successive punching operation is received. The separated electronic components may hereby be sorted based on multiple different selection criteria.

The selective activation of the punches during the first execution of step C) may be based on quality level information obtained during a first operation previously performed on the frame with electronic components while the selective activation of the punches during the re-execution of step C) may be based on quality level information obtained during a second operation previously performed on the frame with electronic components. This successive selection of different sets of electronic components for separation is an effective way to separate the electronic components based on multiple sources of quality level information.

The selective separation of the electronic components from a frame may be preceded by a forming or trimming operation for manipulating the electronic components connected to the frame, wherein the outcome of the forming or trimming operation determines which electronic components are separated from the frame during the selective separation. As already mentioned, separation of electronic components based on the outcome of a preceding forming or trimming operation ensures that electronic components that do not meet predetermined quality requirements end up in subsequent processing steps, thereby leading to the possible interruption of said process or the malfunctioning of the involved tools/process stations.

Alternatively, the selective separation of the electronic components from a frame may be followed up by a forming or trimming operation for manipulating the electronic components connected to the frame. In this instance, any electronic components that may adversely affect the subsequent forming or trimming operation may be pro-actively removed from the frame. It may also be possible to combine a forming or trimming operation with a preceding and a following selective separation of electronic components to attain all of the just described benefits to both the forming or trimming operation as well as any subsequent processing steps.

BRIEF DESCRIPTION OF THE DRAWINGS

The present invention will be further elucidated on the basis of the non-limitative exemplary embodiments shown in the following figures, wherein:

FIGS. 2A and 2B top views on a frame before selective separating electronic components from the frame (2A) and after selective separating electronic components from the frame according the method of the present invention (2B);

DESCRIPTION OF THE INVENTION

Figure 1:
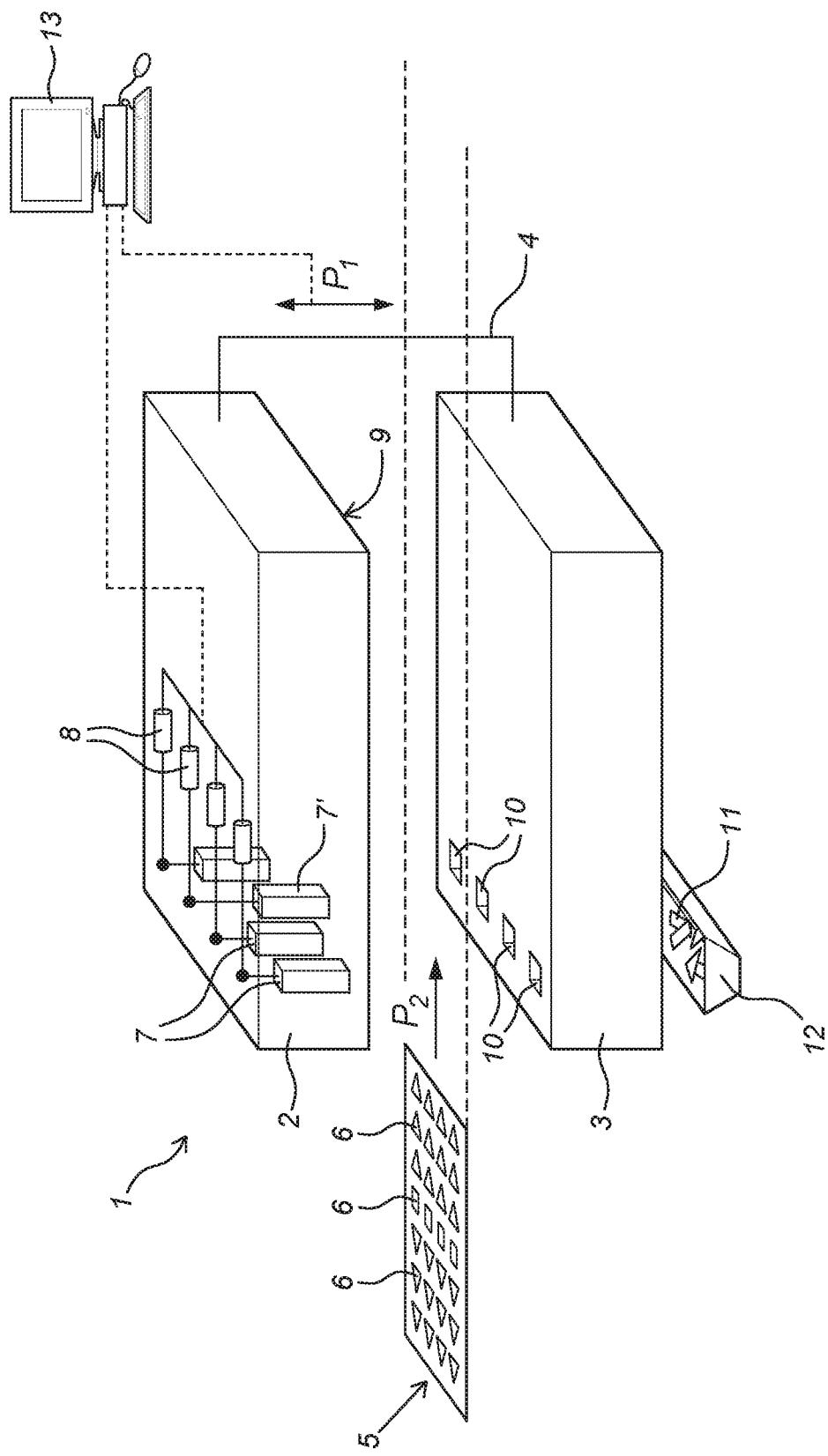
FIG. 1 shows a schematic perspective view on a separating device according to the present invention.

FIG. 1 shows a separating device 1 according the present invention having two press parts 2, 3 that are moveable towards and away from each other (see arrow $P_1$) with drive means (not depicted here). Between the press parts 2,3 is a guide provided for moving a frame 5 with electronic components 6 (see arrow $P_2$) to a processing position. In the upper press part 2 a plurality of punches 7 is installed, which punches 7 are connected to individual punch controls 8 (here depicted as cylinders). In the figure one of the punches 7' is placed in a lower (active) position while the other punches 7 are all in a higher position wherein the do not protrude from a contact surface 9 of the upper press part 2. In the opposite (lower) press part 3 openings 10 are provided to allow the punches 7 to press electronic components 6 out of the frame 5 and to let the separated electronic components 11 to pass through the lower press part and to fall into a collecting bin 12. The positioning of the punches 7, the movement of the press parts 2,3 and the guiding of the frames 5 along the guide 4 are all controlled by an intelligent control system 13.

Figure 2A:
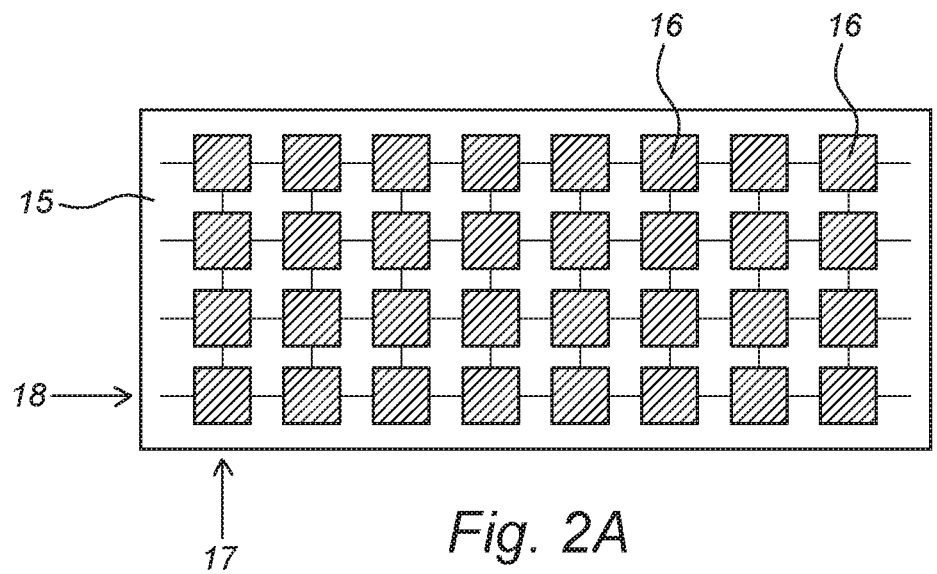
Figure 2B:
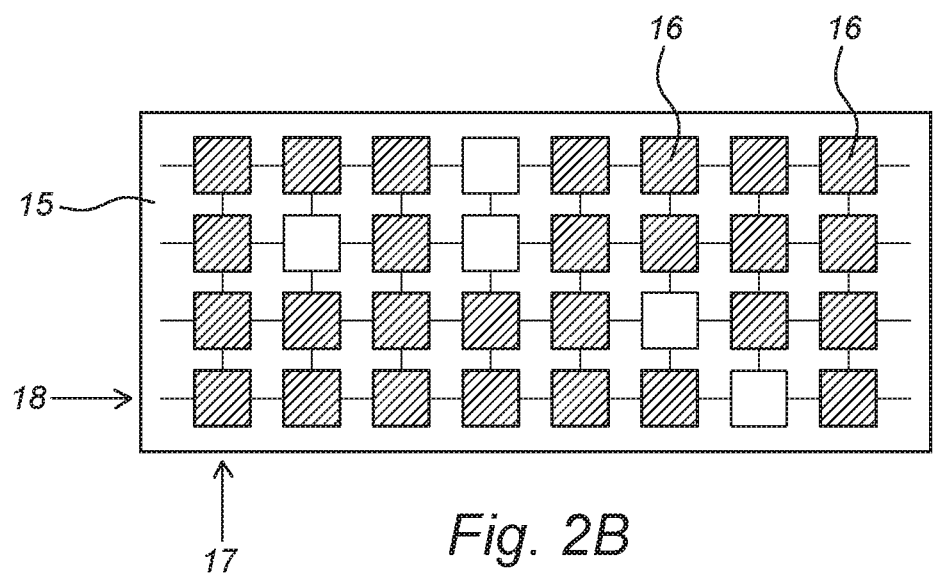

In FIG. 2A a frame (strip) 15, usually made out of metal, is shown including moulded electronic components 16 paced in array with columns 17 and rows 18 (here columns of four electronic components and rows of eight electronic components but these numbers may be varied). After the selective separating of some of the moulded electronic components 16 (e.g. due to malfunction and/or incorrect moulding of individual electronic components 16) as shown in FIG. 2B some electronic components 16 are separated from the frame 15 (here on the positions of column/row 2/3, 4/3, 4/4, 6/2 and 7/1).

Figure 3:
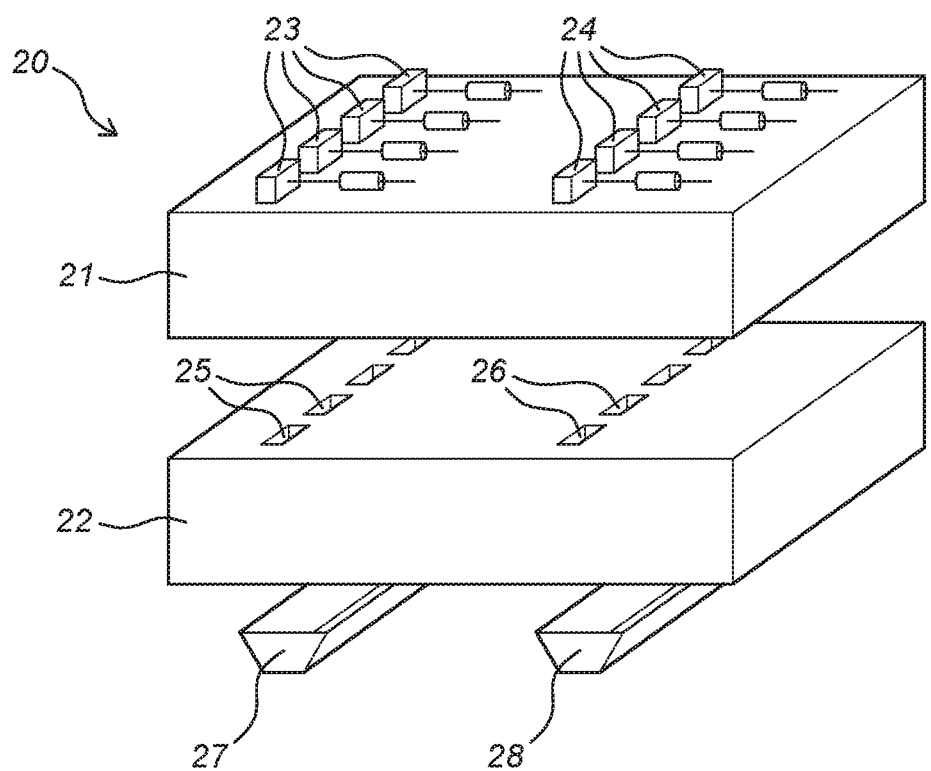
FIG. 3 shows a schematic perspective view on an alternative embodiment of a separating device according to the present invention.

FIG. 3 shows an alternative embodiment of a separating device 20 according the present invention again having two press parts 21, 22 that corresponds for a substantial part with the separating device 1 as shown in FIG. 1 however here in the upper press part 21 a plurality of punches 23, 24 is installed in two parallel lines. According the positioning of the punches 23, 24 also two corresponding lines of apertures (openings) 25, 26 are provided to allow the punches 23, 24 to separate individual electronic and to let these separated electronic components to pass through the lower press part 22 and to fall into one of two collecting bins 27, 28.

Figure 4:
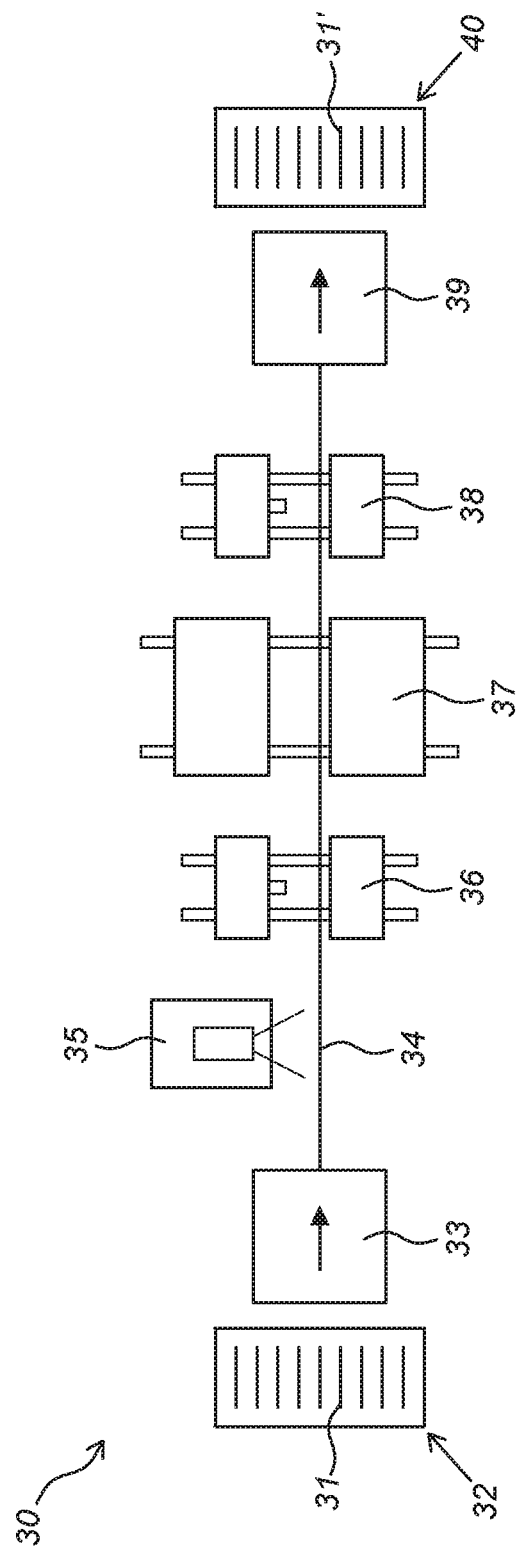
FIG. 4 shows a schematic view on a system for in-line selective separating electronic components from a frame according the present invention.

FIG. 4 shows a system 30 for in-line selective separating electronic components from frame 31 with electronic components. The frames arrive in a cassette 32 and an off-loader 33 removes individual frames 31 from the cassette 32 and placed them on a guide 34. In the line represented here in a first position a visual inspection unit 35 perform an inspection and in a subsequent second position a separating device 36 according the present invention separates electronic components, for instance electronic components that are inspected by the inspection unit 35 as electronic components with inaccurate dimensions. In a subsequent third operating position a forming unit 37 may for instance bend leads of the electronic components that were still remaining in the frame after passing the separating device 36. In a fourth processing position a second separating device 38 according the present invention electronic components may be separated that for instance were detected as incorrect during the previous processing step in the forming unit 37. Then as a last processing step in the in-line system 30 a loader 39 may put the processed frames 31' in a cassette 40 again.

The invention claimed is:

1. A device for selective separating electronic components from a frame with electronic components, comprising;
    at least two press parts which are displaceable relative to each other;
    drive means for moving the press parts towards and away from each other;
    a guide for guiding the frame between the press parts;
    a frame drive for moving the frame along the guide between the press parts;
    a plurality of punches installed in a first press part, which punches are connecting to individual punch controls;
    a plurality of openings in a second press part, opposite to the individually controlled operative punches in the first press part; and
    an intelligent control system connecting to the individual punch controls, characterised in that the intelligent control system connects to the frame drive and the intelligent control system is configured to control the individual punch controls and the frame drive based on information on component quality level obtained from previous operations performed on the frame with electronic components.

2. The separating device according to claim 1, characterised in that the punches are individually moveable between an operative position and an inoperative position.

3. The separating device according to claim 2, characterised in that the individual punch controls are cylinders.

4. The separating device according to claim 1, characterised in that the openings in the second press part connect to at least one collecting bin for receiving punched out electronic components.

5. The separating device according to claim 4, characterised in that the separating device comprises plural collecting bins, which collecting bins are displaceable by a collecting bin drive and the intelligent control system connects to the collecting bin drive.

6. The separating device according to claim 1, characterised in that the intelligent control system is configured to control the individual punch controls and the frame drive to perform multiple successive punching operations, wherein the frame drive retains the frame in the same position along the frame guide and the collecting bin drive exchanges collection bins between said subsequent punching operations.

7. The separating device according to claim 6, characterised in that the intelligent control system is configured to use the quality level information obtained during one operation performed on the frame with electronic components to set the individual punch controls during a first punching operation and to use the quality level information obtained during another operation performed on the frame with electronic components to set the individual punch controls during a successive punching operation.

8. The separating device according to claim 1, characterised in that the punches in the first press part are installed in a line, which line of punches is oriented perpendicular to the frame guide.

9. The separating device according to claim 8, characterised in that the punches in the first press part are installed in plural lines, which lines of punches are oriented perpendicular to the frame guide.

10. A system for in-line selective separating electronic components from the frame with electronic components, comprising at least one separating device according to claim 1, and at least a loader and/or off-loader for the frame with electronic components.

11. The system for in-line selective separating electronic components according to claim 10, characterised in that the system also comprises at least one inspection unit for individual inspection of the electronic components in a frame.

12. The system for in-line selective separating electronic components according to claim 10, characterised in that the system also comprises a processing unit acting on the frame with electronic components.

13. The system for in-line selective separating electronic components according to claim 12, characterised in that the processing unit is a forming unit or a trimming unit for manipulating electronic components connected to the frame, which processing unit is positioned upstream from the separating device.

14. The system for in-line selective separating electronic components according to claim 12, characterised in that the processing unit is a forming unit or a trimming unit for manipulating electronic components connected to the frame, which processing unit is positioned downstream from the separating device.

15. A method for selective separating electronic components from the frame with electronic components with a separating device according to claim 1, comprising the processing steps:
  A) opening the press parts by moving the press parts away from each other;
  B) feeding the frame with electronic components over a controlled distance forwards between the moved apart press parts;
  C) selective activating those punches of the plurality of punches that correspond to the positions of a first set of electronic components that during a next processing step have to be separated from the frame; and
  D) moving the press parts towards each other such that the activated punches on the corresponding locations separate the electronic components from the frame.

16. The method according to claim 15, characterised in that the separated electronic components are received at a controlled location and the intelligent control system registers which separated electronic components are received at which location.

17. The method according to claim 16, characterised in that the separated electronic components received at various locations are differentiated on a quality level.

18. The method according to claim 15, characterised in that step D) is followed up by re-executing steps A), C) and D) while the frame is retained in the same position between the press parts, wherein during the re-execution of step C), those punches of the plurality of punches are selectively activated that correspond to the positions of a second set of electronic components that during a next processing step have to be separated from the frame.

19. The method according to claim 18, characterised in that the selective activation of the punches during the first execution of step C) is based on quality level information obtained during a first operation previously performed on the frame with electronic components and that the selective activation of the punches during the re-execution of step C) is based on quality level information obtained during a second operation previously performed on the frame with electronic components.

20. The method according to claim 15, characterised in that the length of the forward movement of the frame during processing step B) is dependent on the number of punches and the number and orientation of electronic components in the frame.

21. The method according to claim 15, characterised in that the selective separation of the electronic components from a frame is in-line coupled with at least one other operation performed onto the frame of electronic components.

22. The method according to claim 21, characterised in that the selective separation of the electronic components from the frame is preceded by a forming or trimming operation for manipulating the electronic components connected to the frame, wherein the outcome of the forming or trimming operation determines which electronic components are separated from the frame during the selective separation.

23. The method according to claim 21, characterised in that the selective separation of the electronic components from the frame is followed up by a forming or trimming operation for manipulating the electronic components connected to the frame.

* * * * *